United States Patent [19] [11] 3,902,078
Peterson [45] Aug. 26, 1975

[54] ANALOG SWITCH

[75] Inventor: Dean E. Peterson, Tujunga, Calif.

[73] Assignee: Crystal Industries, Inc., Hollywood, Calif.

[22] Filed: Apr. 1, 1974

[21] Appl. No.: 456,533

[52] U.S. Cl. ................ 307/251; 307/304; 328/165; 328/172; 330/145

[51] Int. Cl.² ................... H03K 17/60; H03K 17/16; H03K 3/353; H04B 1/10

[58] Field of Search .................... 307/237, 251, 304; 328/150, 151, 165, 172; 330/9, 145, 164

[56] References Cited

UNITED STATES PATENTS

| | | | |
|---|---|---|---|
| 3,408,511 | 10/1968 | Bergersen et al. | 307/304 X |
| 3,448,293 | 6/1969 | Russell | 307/304 X |
| 3,538,349 | 11/1970 | Smith | 307/304 X |
| 3,678,297 | 7/1972 | Takahashi | 307/251 |
| 3,731,116 | 5/1973 | Hill | 307/251 |
| 3,764,921 | 10/1973 | Huard | 328/151 |
| 3,818,246 | 6/1974 | Hellwarth | 307/251 |

OTHER PUBLICATIONS

Millman et al., Electronic Devices and Circuits, McGraw-Hill Book Co., 1967, pp. 359–362.

*Primary Examiner*—John S. Heyman
*Assistant Examiner*—L. N. Anagnos
*Attorney, Agent, or Firm*—Harris, Kern, Wallen & Tinsley

[57] ABSTRACT

A solid state analog switch including a normally conducting FET having its gate isolated from its source and drain by high input, low output impedance unity gain amplifiers and connected to a switch controlled constant current source for developing a small voltage drop at the gate substantially equal to the gate-to-mid-channel cutoff voltage of the FET and just sufficient to instantaneously turn off the FET upon activation of the constant current source.

8 Claims, 10 Drawing Figures

ANALOG SWITCH

The present invention relates to solid state switching devices and more particularly to a high speed analog switch having an extremely low noise characteristic.

In the past, the signal-to-noise ratio associated with magnetic recorders has been a major limiting factor in the quality of professional audio recording systems. The recent advent of noise-reduction circuitry for magnetic tape recorders, however, has substantially improved the signal-to-noise ratio in such recorders and in turn has resulted in more stringent noise requirements within the balance of the audio recording systems. At present, the leading contributor to the noise problems in such systems appears to be the voltage controlled attenuators commonly employed therein.

One attempt to reduce the high noise levels associated with voltage controlled attenuators has been to utilize attenuator circuits comprising a plurality of series and parallel connected resistors shunted by and in series with solid state switches. By selective control of the switches, as by binary coded control signals, the loss introduced by the attenuator may be selectively changed in a step by step manner with a noise reduction over conventional voltage controlled attenuators.

While such switch controlled attenuators represent a significant improvement over prior voltage controlled attenuators, the solid state switches included in such attenuators still introduce undesired signal level dependent noise as they change states. Also, present solid state switches are subject to undesired turn-on in response to large analog signals unless biased by large voltage sources.

Accordingly, it is an object of the present invention to provide a high speed switch for analog signals having an extremely low and input signal level independent noise characteristic.

Another object of the present invention is to provide a switch of the foregoing character which requires only a small bias voltage to maintain the switch in a non-conductive state even in response to large analog input voltage signals.

Still another object of the present invention is to provide a switch of the foregoing character including a normally conducting FET having its gate isolated from its source by a high input, low output impedance unity gain amplifier and connected to a switch controlled constant current source for developing a small voltage drop at the gate substantially equal to the gate-to-mid-channel cutoff voltage of the FET and just sufficient to instantaneously turn off the FET upon activation of the constant current source.

The foregoing as well as other objects and advantages of the present invention may be more clearly understood by reference to the following detailed description when considered with the drawings which by way of example only illustrate preferred forms of the present invention as well as conventional prior art switching circuitry.

Figure 2:
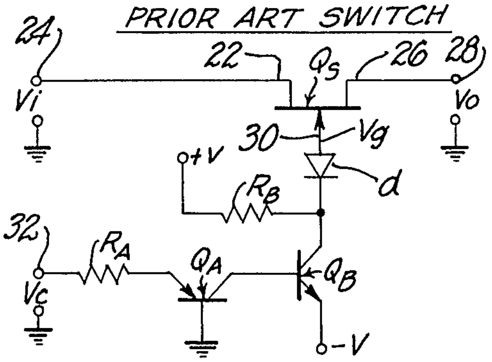
FIG. 2 is a schematic of a typical prior art solid-state switch included in attenuators such as illustrated in FIG. 1.
Figure 3A:
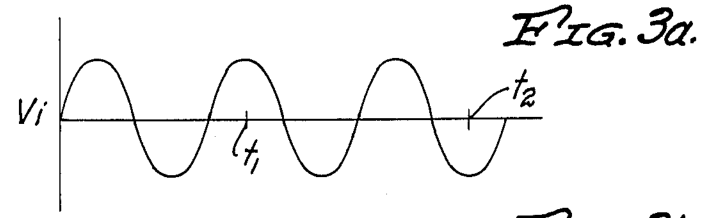

FIGS. 3*a*, *b*, and *c* are diagrammatic illustrations of the signal waveforms developed at the input, gate and output of the solid-state switch of FIG. 2 during operation of the switch and in response to an analog input signal.

Figure 3B:
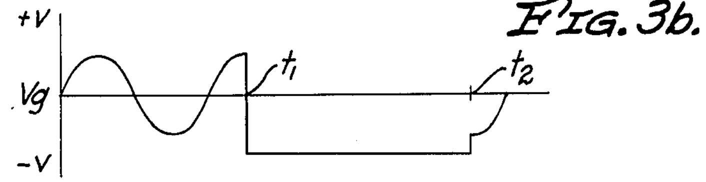
Figure 4:
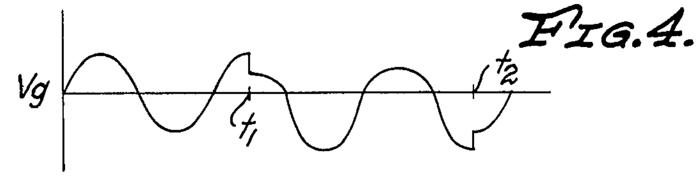
Figure 5:
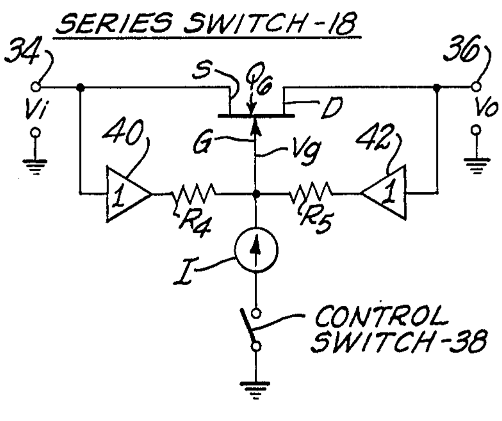
Figure 6:
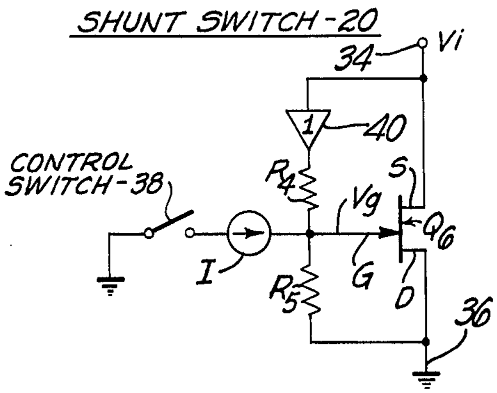
Figure 7:
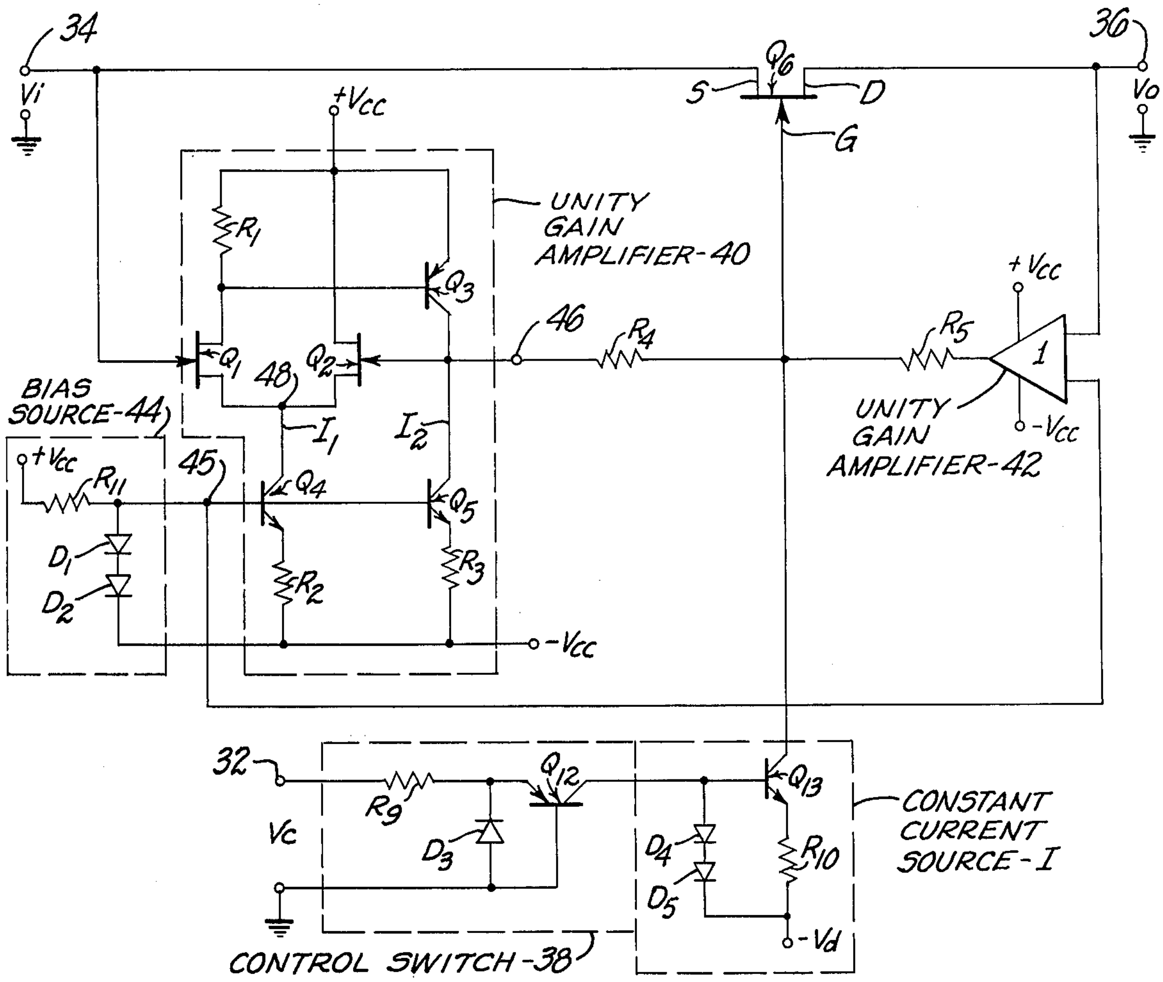
Figure 8:
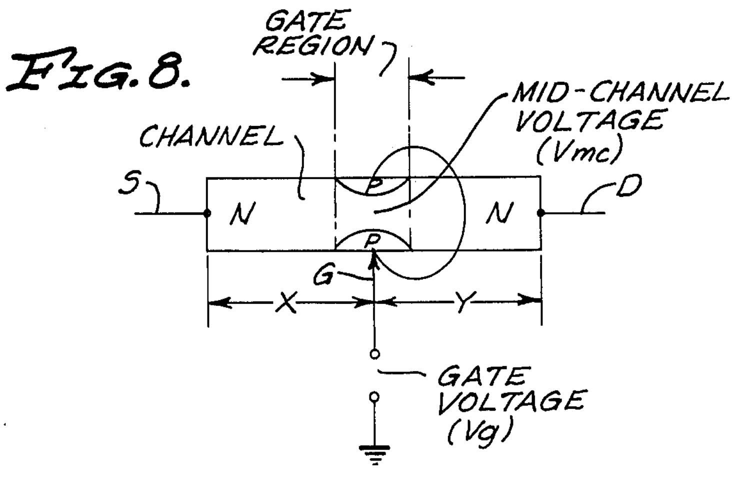

FIG. 4 is a diagrammatic illustration of the signal waveform developed at the gate in the solid state switch of the present invention shown in FIG. 5 in contrast to the gate voltage developed in the circuit of FIG. 2 and illustrated in FIG. 3*b*;

FIG. 5 is a schematic drawing of a series switch embodying the features of the present invention;

FIG. 6 is a schematic drawing of a shunt switch embodying the features of the present invention;

FIG. 7 is a detailed schematic of a preferred form of solid-state switch circuit of the present invention; and FIG. 8 is a diagrammatic representation of the structure of a conventional switching FET.

As previously indicated, an attenuator now being proposed for use in audio recording systems is a switch controlled attenuator. One such attenuator is represented generally in FIG. 1 as including a plurality of series connected resistors 10 between an input terminal 12 and a output terminal 14. The attenuator also includes a plurality of parallel connected resistors 16. In parallel with each series resistor 10 is a series switch 18 and in series with each parallel resistor 16 is a shunt switch 20. By selective control of the series and shunt switches, the attenuation presented by the attenuator to an analog signal applied at the input terminal 12 may be controlled in a step by step manner.

Figure 1:
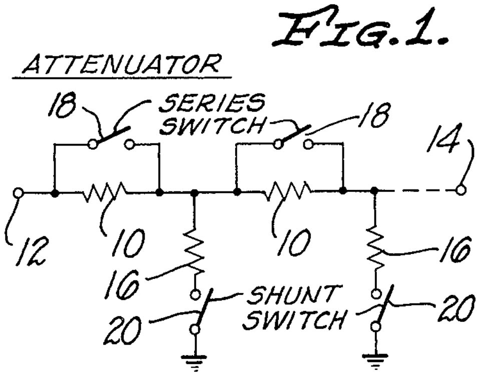
FIG. 1 is a schematic drawing of a typical switch-controlled attenuator.

Because of its extremely low impedance in a conductive state and its high impedance in a non-conductive state as well as its speed of switching between states, field effect transistors (FET) are commonly employed as solid state switches and have been proposed for use in an attenuator such as illustrated in FIG. 1. A conventional form of such a switching FET circuit is illustrated in FIG. 2. As represented, the switching circuit includes an FET, $Q_S$, having its source 22 connected to an input terminal 24 and its drain 26 connected to an output terminal 28. The gate 30 of the $Q_S$ is connected to a diode d having its cathode connected to the collector of a transistor $Q_B$ and through a biasing resistor $R_B$ to a positive voltage source +V. The emitter of transistor $Q_B$ is connected to a negative voltage source-V while the base of the transistor $Q_B$ is connected to the collector of a transistor $Q_A$. The transistor $Q_A$ has its base connected to a reference ground and its emitter connected to a control terminal 32 through a resistor $R_A$. A voltage Vc, such as a series of binary coded signals may be applied to the control terminal 32.

Figure 3C:
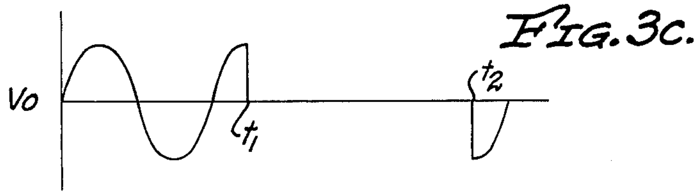

Generally speaking and referring to the signal waveforms of FIGS. 3*a*, 3*b* and 3*c*, the switch of FIG. 2 is designed such that $Q_S$ is normally conducting to pass an analog input signal $V_i$ directly to the output terminal 28 as an output signal $V_o$. When it is desired to swtich $Q_S$ to a non-conductive state to block signal flow through the switch (e.g. open the switch) a positive control signal is applied to the control terminal 32. This is indicated as occurring at a time $t_1$. When a positive control voltage $V_c$ (typically 5 volts) is applied to the control terminal 32, the normally non-conducting transistor $Q_A$, conducts collector current causing $Q_B$ to switch to a conductive state. As this occurs, the gate voltage $V_g$ of the $Q_s$ clamps at a fixed negative voltage represented by the following equation, $$V_g = -V + (V_{cb} + V_d)$$

where $-V$ is the voltage of the negative voltage source, $V_{eb}$ is the collector to emitter voltage drop of the transistor $Q_B$ in a saturated condition and $V_d$ is the voltage drop across the diode d. The clamping of the gate 30 reverse biases $Q_s$ and turns "off" the switch.

It bears emphasizing that a turning "on" of the transistor $Q_B$ sets the gate voltage $V_g$ at a fixed negative value. Under such conditions, as the value of the analog input signal, $V_i$, increases in negative value, a point may be reached where the voltage difference between the input signal and $V_g$ is less than the gate-to-source cutoff voltage for $Q_s$. When this occurs, $Q_s$ will begin to conduct. Such operation is undesired and to insure against it requires that the value of the negative voltage −V be greater than the maximum negative signal input by at least the value of the voltage drop across the diode d and the gate-to-source cutoff voltage for $Q_s$. The use of large bias voltage sources is one undesirable feature of the prior art switch illustrated in FIG. 2 and requires that $Q_s$ to be able to withstand a gate-to-source reverse voltage of at least the maximum expected value of the input signal plus V. A typical rating for the maximum gate-to-source reverse voltage for $Q_s$ is about 35.5 volts. FIG. 3*b* illustrates a signal waveform for the gate voltage $V_g$, in the switch circuit of FIG. 2. As indicated, at the instant of switching, $t_1$, $V_g$ is clamped to a negative value greater than the maximum negative value of the expected input signal, remaining at that fixed negative value until the control signal $V_c$ is removed and $Q_B$ returned to its non-conductive state. That occurs at $t_2$ to produce a forward biasing of the gate-to-source junction of $Q_s$ and an effective closing of the switch to pass the input signal to the output terminal 28.

In addition to the required use of large negative biasing sources in conventional FET switching circuits, it is generally recognized that all FET switches suffer from capacitive coupling of the gate-to-signal channel between the source and drain of the FET. Typical switching FET's exhibit about 20 picofarads of gate-to-channel capacitance at zero volts gate-to-channel bias. The gate-to-channel capacitive coupling must be charged when turning the FET "off" and discharged when turning it "on". Such charging and discharging causes noise spikes to be coupled to the signal path each time the FET transitions. For example and assuming zero volts input signal, to switch the circuit of FIG. 2 to an "off" condition requires that the gate-to-channel capacitive coupling be charged approximately −20 volts. To cause the switch to transition to an "on" condition requires that the gate-to-channel capacitive coupling discharge the −20 volts. At least a 20 volt noise spike is coupled into the signal path upon each transition of the switch.

Further, the amount of charge capacitively coupled to the signal path is input signal level dependent. For example, if a voltage input of about 15 volts is applied to the circuit of FIG. 2 at the time of switching "off", the gate-to-channel capacitance must charge to about 35 volts. At negative input voltage of 15 volts about 5 volts charges this capacitance. Thus, the noise signals introduced into the signal path upon transitioning of the switch vary with the magnitude of the input signal then applied to the input terminal 24.

In addition to requiring high bias voltage sources and introducing large signal dependent noise spikes into the signal path upon transitioning, the prior art switch of FIG. 2 is also somewhat sensitive in its turn-on time due to the temperature sensitivity of the gate diode *d*. Thus as the temperature to which the switch is subjected varies, the switching time of the switch varies.

The solid state switch of the present invention overcomes the foregoing problems by including a normally conducting FET having its gate isolated from its source and drain by high input, low output impedance unity gain amplifiers. The gate also is connected to a switch controlled constant current source for developing a small voltage drop at the gate substantially equal to the gate-to-mid-channel cutoff voltage ($V_{gmc\ off}$) of the FET and just sufficient to instantaneously turn off the FET upon activation of the constant current source.

The gate-to-mid-channel voltage ($V_{gmc}$) for a FET is the difference between the gate voltage ($V_g$) for a FET and its mid-channel voltage ($V_{mc}$). The gate-to-mid-channel cutoff voltage is the value of $V_{gmc}$ at which the FET ceases to conduct current. Such voltages are referred to in the diagrammatic representation of a typical switching FET shown in FIG. 8. As there represented, the FET includes a main body of semi-conductor material, here being of an N-type. One end of the semi-conductor material comprises the source S for the FET and the opposite end of the drain, D. The main body of semi-conductor material between the source S and drain D comprises the channel or the signal path for voltage signals applied to the source S. The gate G, for the FET consists of small quantitities of P-type semi-conductor materials potted in the top and bottom of the main semi-conductor and electrically connected together. In FIG. 8, X represents the distance between the source S and the gate G and Y represents the distance between the gate G and the drain D.

In an FET, the area of the channel between the quantities of P-type material is known as the gate region of the FET. The gate voltage $V_g$ is measured between the gate G and a reference ground. The mid-channel voltage $V_{mc}$ is the voltage generated at a mid-location within the gate region of the channel. For a symmetrical switching FET the mid-channel voltage $V_{mc}$ is usually equal to one-half a sum of the voltage input $V_i$ and voltage output $V_o$ developed at the source S and drain D respectively. Likewise, when the gate G is adjacent to the center of the main body of the FET the gate voltage $V_g$ is generally one-half a sum of the input and output voltage ($V_i$ and $V_o$). Under such circumstances the gate-to-mid-channel voltage ($V_{gmc}$), that is the voltage difference between the gate voltage ($V_g$) and mid-channel voltage ($V_{mc}$), is zero. It has been found experimentally that if the gate voltage $V_g$ is reduced relative to the mid-channel voltage $V_{mc}$ a depletion layer rapidly builds up within the gate region of the FET to cut-off the flow of carriers at a center of the channel. The value of the gate-to-mid-channel voltage $V_{gmc}$ at which the flow of carriers is cutoff is the gate-to-mid-channel cutoff voltage $V_{gmc\ off}$. In practice, this has been found to be of less than 10 volts and to be independent of the value of the input voltage applied to the source S of the switching FET.

These discovered principles and characteristics of switching FET have been incorporated in the present invention to produce switching circuits that are substantially temperature independent, do not require large biasing sources, and generate minimal input signal level independent noise spikes upon transitioning. FIGS. 5 and 6 represent basic series and shunt forms of the present invention that are particularly useful in attenuators such as represented in FIG. 1.

Referring specifically to FIG. 5, the basic form of the series switch of the present invention comprises a switching FET $Q_6$ having its source S connected to an input terminal 34 for receiving an analog input signal $V_i$ and its drain D connected to an output terminal 36 at which is developed an analog output signal $V_o$. The gate G of $Q_6$ is connected to the output of a constant current source I, the operation of which is selectively controlled by a control switch 38. The gate G is also connected to a junction of two resistors $R_4$ and $R_5$. Operational unity gain amplifiers 40 and 42 having high input and low output impedances and low bias currents are connected in series with the resistors $R_4$ and $R_5$ respectively and to the input and output terminals 34 and 36 respectively. The unity gain amplifiers function to buffer or isolate the gate G from the input and output terminals.

The gate G is normally zero biased relative to the midchannel voltage $V_{mc}$ such that $Q_6$ is normally conducting. In this regard, it is important for $Q_6$ that a balance exist between the geometric location of the gate G relative to the source and drain, S and D, and the values of the resistors $R_4$ and $R_5$. In this respect, and referring to the dimensional notations set forth in FIG. 8, it has been experimentally determined that it is desirable that the distance X be related to the total length of the channel of the FET in the same proportion that the value of the resistor $R_4$ is to a sum of the values of the resistors $R_4$ and $R_5$. Stated as an equation, it has been found desirable that $$\frac{X}{X+Y} = \frac{R_4}{R_4+R_5}$$

In the case of a conventional switching FET, where by predesign the gate G is located directly under the center of the channel, the above equation is satisfied when $R_4 = R_5$.

The series switch circuit of FIG. 5 utilizes the discovered relationship between the previously defined midchannel voltage $V_{mc}$ and gate voltage $V_g$ of $Q_6$ to provide a rapid acting, temperature insensitive, solid state switch which produces a minimum noise signal upon transitioning. In this regard, please recall that the midchannel voltage $V_{mc}$ of $Q_6$ is one-half the sum of the input and output voltages $$V_{mc} = \frac{V_i + V_o}{2}$$

Likewise, when $Q_6$ is conducting the gate voltage $V_g$ is equal to the mid-channel voltage $V_{mc}$ and the gate-to-mid-channel voltage $V_{gmc}$ is zero. In accordance with the present invention, to turn $Q_6$ "off" only requires a small drop in the gate voltage $V_g$ to a level less than the mid-channel voltage $V_{mc}$ by an amount equal to or slightly greater than the gate-to-mid-channel cutoff voltage $V_{gmc\ off}$ for $Q_6$. In this regard, in the circuit configuration of FIG. 5 and with the gate G located immediately beneath the center of the channel of $Q_6$ and $R_4 = R_5$, when the control switch 38 is closed, the voltage at the gate G becomes $$V_g = \frac{V_i + V_o}{2} - \frac{IR}{2},$$

where $I$ is the value of the current from the constant current source I, and $R$ is the value of one of the resistors $R_4$ or $R_5$. When the value of the small voltage drop at the gate G produced by operation of the constant current source I equals or exceeds the value of the gate-to-mid-channel cutoff voltage $V_{gmc\ off}$, $Q_6$ immediately switches to a non-conducting or "off" condition. It bears noting that to accomplish such a switching action only requires that one-half the product of the current from the source I and one of the resistors $R_4$ or $R_5$ equal or exceed the value of the gate-to-mid-channel cutoff voltage.

A signal waveform for the gate voltage $V_g$ during transitioning of $Q_6$ is illustrated in FIG. 4. In FIG. 4 the gate voltage $V_g$ upon transitioning of $Q_6$ changes by an amount just equal to or slightly greater than the gate-to-mid-channel cutoff voltage of $Q_6$. The instantaneous value of $V_g$ thereafter continues to vary with the input signal $V_i$ applied to the input terminal 34. The drop in the gate voltage upon actuation of the current source I causes a depletion layer to develop within $Q_6$ which cuts off the flow of carriers at the center of the channel within the gate region. Thus, upon the dropping of the gate voltage by the gate-to-mid-channel cutoff voltage there is developed a gate-to-mid-channel voltage equal to or greater than the cutoff value and an effective opening of the series switch such that the output voltage $V_o$ becomes zero as illustrated in FIG. 3*c*.

Contrast the operation of the series switch 18 and the gate voltage $V_g$ illustrated in FIG. 4 with that shown in FIG. 3*b*. When the prior art switch of FIG. 2. is to transition to non-conducting or open state, the gate voltage $V_g$ is clamped at a negative fixed voltage which must exceed the maximum negative input voltage applied to the input terminal 24, e.g. about −20 volts. In the switch of the present invention, the switch will remain open independent of the magnitude of the negative input signals applied thereto, so long as the current source I is actuated and develops at the gate G a voltage drop equal to or slightly greater than the gate-to-mid-channel cutoff voltage of $Q_6$. Thus, the operation of the switch of the present invention is input signal level independent. This is of major importance when noise problems are considered.

In particular, by virtue of the isolation of the gate G from the input and output terminals 34 and 36, the resistors $R_4$ and $R_5$ are decoupled or buffered from the rest of the signal path and interaction of the gate and the channel is restricted to the gate-to-channel capacitance. There is no forward gate current flow in the present invention. Further, since at any instant of time the voltage change at the gate to transition $Q_6$ from a conducting to a non-conducting state or from a non-conducting to a conducting state is the gate-to-mid-channel cutoff voltage of $Q_6$, the gate-to-channel capacitance charges and discharges an equal voltage upon each transition of $Q_6$. This means that uniform noise signals are generated independent of the input signal level to the switch.

Moreover and as depicted in FIGS. 3*b* and 4, noise signals generated by a charging and discharging of the gate-to-channel capacitance of $Q_6$ is less than the minimum noise signal developed by the prior art switch, e.g. at the negative-most swing of the input signal ($t_2$). Of course, the noise signals generated by the transitioning of $Q_6$ are substantially less than the noise spikes generated upon a transitioning of the prior art switch at a maximum input signal level ($t_1$). In fact, as the gate-to-channel voltage in the present invention always changes by the minimum amount required to turn off $Q_6$, the noise generation in the present invention is the minimum obtainable using an FET as the switching element.

FIG. 6 represents a shunt switch which may be utilized as the shunt switch 20 in the attenuator of FIG. 1. The shunt switch 20 is of substantially the same circuit configuration as the series switch 18 except that the input terminal 34 is connected to receive the input voltage $V_i$ and the output terminal 36 is connected to a reference ground. Because of the connection of the output terminal 36 to the reference ground, the unity gain amplifier 42 may be eliminated in the shunt switch circuit 20, it being unnecessary to provide additional high impedance decoupling or isolation of the gate and resistance $R_5$ from the signal path.

The operation of the shunt switch 20 is the same as that previously described for the series switch 18. In that regard, the control of the conductive state of $Q_6$ is by actuation of the constant current source I. The value of the constant current source I is proportioned relative to the values of the resistors $R_4$ and $R_5$ such that upon a closing of control switch 38 and an actuation of the current source I, a voltage drop is developed at the gate G equal to or slightly greater than the gate-to-mid-channel cutoff voltage of $Q_6$ to instantaneously turn off $Q_6$. Upon turn off of $Q_6$, the switch 20 is opened. When $Q_6$ is returned to its conducting state, as by an opening of the control switch 38 and the deactivation of the constant current source I, the input terminal 34 is effectively clamped to ground. Again, noise signals introduced into the attenuator circuit by transitioning of the shunt switch 20 are input signal independent and the minimum for use of an FET in the switch configuration.

While FIGS. 5 and 6 have illustrated the control switch 38 as being mechanical in form, such is merely for purpose of simplicity and illustration. In actual practice, control switch 38 comprises a solid state switch regulated by a pulse signal, such as a binary coded signal generated in a manner as to simultaneously regulate the opening and closing of the series switches 18 and shunt switches 20 in the attenuator. Such control provides means for stepping the loss presented by the attenuator between various values to regulate the level of signals passing between the input terminal 12 and the output terminal 14 of the attenuator.

A preferred form of the solid state switch of the present invention including such a solid state control switch configuration as illustrated in FIG. 7, wherein reference numerals and notations corresponding to those employed in FIGS. 5 and 6 are again employed to depict like circuit elements.

In the circuit of FIG. 7, the solid state analog switch includes a bias source or network 44 common to the unity gain amplifiers 40 and 42. As illustrated, the bias source 44 includes a source of positive voltage $V_{cc}$, a resistor $R_{11}$ and two diodes $D_1$ and $D_2$ connected in series with a source of negative voltage $-V_{cc}$. A junction of the resistor $R_{11}$ and the diode $D_1$ is connected to an output 45 for the bias source 44 which in turn is connected to an input to constant current source portions of the identical unity gain amplifiers 40 and 42.

Referring to the unity gain amplifier 40, the constant current source portion thereof includes transistors $Q_4$ and $Q_5$. $Q_4$ and $Q_5$ are connected in a current source feedback configuration with emitter resistors $R_2$ and $R_3$ connected to the negative voltage source $-V_{cc}$. The value of the currents generated by the current sources may be represented by the following equation, $$I_n = \frac{V_{D_1} + V_{D_2} - V_{BE}}{R_E},$$

where $V_{D_1}$ and $V_{D_2}$ are the forward voltage drops of the diodes $D_1$ and $D_2$, $V_{BE}$ is the base-emitter drop of $Q_4$ or $Q_5$, and $R_E$ is the value of the emitter resistor $R_2$ or $R_3$ associated with $Q_4$ or $Q_5$. Typically, $R_2$ and $R_3$ are selected to provide a current flow in $Q_4$, $I_1$ equal to 400 $\mu$a and a current flow in $Q_5$, $I_2$ equal to 4 ma.

In addition to the constant current sources including the transitors $Q_4$ and $Q_5$, the unity gain amplifier 40 includes a differential amplifier stage strapped for unity gain. The differential amplifier stage includes two FET's $Q_1$ and $Q_2$ connected as source followers with their sources connected in common to the collector of $Q_4$ and their drains connected to the positive voltage source $+V_{cc}$, the drain of $Q_1$ being connected thereto through a biasing resistor $R_1$. $Q_1$ and $Q_2$ are chosen for equal gate-to-source voltage at a drain current equal to one-half $I_1$. The differential amplifier stage is strapped for unity gain by connection of the gate $Q_2$ to an output terminal 46 and to the collector of a transistor $Q_3$ having its emitter connected to $+V_{cc}$ and its base connected to the drain of $Q_1$ in a feedback configuration. The gate of $Q_1$, in turn, is connected to the input terminal 34 to receive the analog voltage input $V_i$.

In operation, the current $I_1$ divides equally between $Q_1$ and $Q_2$ in the quiescent state, that is when the input is grounded. The drain current of $Q_1$ divides between $R_1$ and the base of $Q_3$. The amount of base current flowing in $Q_3$ in the quiescent state is simply $$\frac{I_2}{\beta}$$

Where $\beta$ is the static common-emitter current transfer ratio of $Q_3$, typically about 100. This means that the quiescent base current of $Q_3$ is typically 40 $\mu$a leaving 160 $\mu$a to flow through $R_1$. As $R_1$ is paralleled by the base-emitter drop of $Q_3$, its value is simply the base-emitter drop of $Q_3$ divided by 160 $\mu$a or typically about 11 kilohms. Thus, component values in the amplifier 40 are selected such that $Q_1$ and $Q_2$ are matched with respect to gate-to-source voltage at a specific constant drain current, and such that when the input terminal 34 is grounded, the collector current in $Q_3$ is equal to $I_2$. Hence no current is delivered to the output terminal 46 when the input voltage is zero.

However, when an incremental positive input voltage $V_i$ is applied to the input terminal 34, the voltage at a junction 48 of the sources of $Q_1$ and $Q_2$ instantaneously increases. This increases the value of the current flowing in $Q_1$ to the base of $Q_3$. In turn, this causes the collector current in $Q_3$ to increase resulting in a positive increase in the gate voltage of $Q_2$ and a positive output voltage excursion at the resistor $R_1$. The positive output excursion and increase in the stage voltage causes $Q_2$ to draw more drain current until it limits the current available to $Q_1$ at which point the output voltage stops rising. This is nearly instantaneous. Accordingly, the feedback circuit functions to maintain a constant current flow in $Q_1$ and $Q_2$ with an output voltage following instantaneously changes in value of the input signal, $V_i$.

As the resistor $R_1$ is typically 11 kilohms and the value of the biasing voltage source $V_{cc}$ is typically 15 volts, the additional base current in $Q_3$ required to produce a full scale positive voltage swing is simply $$\frac{15v}{\beta\ 11 \times 10^3\ \Omega}$$

or typically 13.6 $\mu a$. Thus a current unbalance of twice that or 27.2 $\mu a$ will exist in $Q_1$ and $Q_2$ with full output voltage. This can be translated to an input-output voltage differential by the formula $$\Delta V = \frac{\Delta I}{gm}$$

where $gm$ is the forward transconductance of $Q_1$ or $Q_2$. A minimal value of $gm$ being approximately 1,000 mhos, means that the value of input differential is 27.2 millivolts. The gain of the amplifier 40 can then be computed as $$Av = \frac{15 - .0272}{15} = .998$$

Similarly, a negative incremental input voltage applied to the input terminal 34 will cause $Q_1$ to draw less drain current which will be reflected as a decrease in a base current of $Q_3$. This in turn will cause a $\beta$-times decrease in the collector current of $Q_3$. As the value of the current $I_2$ is now greater than the emitter-collector current flowing in $Q_3$, the output voltage drops until the drain current $Q_2$ falls to the point that $Q_1$ must conduct more drain current, the sum of the drain currents of $Q_1$ and $Q_2$ always being equal. This stops the negative excursion.

It is to be emphasized that the changes in voltage and currents described above occur almost instantaneously with a time scale of tens of nanoseconds; $Q_1$ and $Q_2$ acting to maintain their drain currents as equal as the finite gain of the circuit will permit.

In the unity gain amplifiers 40 and 42, FET's are included owing to their exceedingly high input impedances and very low bias current requirements. Furthermore, the action of the feedback circuit included in the amplifier multiplies the input impedance by the factor of $$\frac{Av}{1 - Av}$$

or approximately 500. Thus, the circuit shown in FIG. 7 typically exhibits an input impedance of $10^{10}$ ohms and bias current requirements of 25 nanoamperes.

The low offset voltage, high input impedance and low bias current characteristics of the amplifiers 40 and 42 provide precision operation for the analog switch circuit illustrated in FIG. 7. In this regard, the input impedance means that the unity gain amplifiers 40 and 42 do not load the input or outputs of the switch circuit. Since bias currents in the amplifiers 40 and 42 flow to the input and outputs of the switch, the low bias current reduces the voltage drops across the source and load impedances and results in a minimum direct current errors at the input and output of the switch circuit well within the permissible noise levels for the switch. For example, assuming a 10,000 ohm source resistance for the switch circuit, the amplifiers 40 and 42 as described will cause gain errors of typically one part per million, and introduce offset (DC) errors of typically 250 micro-volts which are certainly acceptable values for the purposes of analog switches.

As described, with the gate of $Q_6$ connected to the resistors $R_4$ and $R_5$ and buffered or isolated from the input and output by the unity gain amplifiers 40 and 42, $Q_6$ normally functions in a conductive state to pass input voltage signals $V_i$ directly from the input terminal 34 to the output terminal 36 with a minimum of loss. When it is desired to change the state of the switch, it is desired to instantaneously cause $Q_6$ to become nonconductive. This is accomplished by activating the constant current source I through the control switch 38. In the form of the invention shown in FIG. 7, the constant current source includes a transistor $Q_{13}$ having its collector connected to the gate G of $Q_6$, its emitter connected through a biasing resistor $R_{10}$ to a negative source of voltage $-V_d$, and its base connected to the control switch 38. In addition, the base of the transistor $Q_{13}$ is connected to $-V_d$ through a pair of series diodes $D_4$ and $D_5$.

The illustrated form of the control switch 38 includes a transistor $Q_{12}$ having its collector connected to the base of the transistor $Q_{13}$, its base connected to a reference ground, and its emitter connected through a biasing resistor $R_9$ to the control terminal 32 for receiving the control voltage $V_c$. In addition, the emitter is connected to the cathode of a diode $D_3$ having its anode connected to the reference ground.

If a positive input $V_c$ is supplied to the control terminal 32, representing a logical "1", the emitter current flowing in the transistor $Q_{12}$ becomes $$\frac{V_c - V_{BE}}{R_9}$$

where $V_c$ is the value of the control voltage, $V_{BE}$ is the base emitter drop of the transistor $Q_{12}$, and $R_9$ is the value of the resistor $R_9$. This causes a collector current of very nearly the same amount of flow in the transistor $Q_{12}$ — a typical value of the collector current being about one milliampere for a $V_c$ of 5 volts. The flow of such a collector current in $Q_{12}$ causes the diodes $D_4$ and $D_5$ to conduct, biasing the base of $Q_{13}$ to about +1.15 volts with respect to $-V_d$. This in turn causes $Q_{13}$ to pass a current represented by the equation $$\frac{V_D + V_D - V_{BE}}{R_{10}}.$$

where the $V_D$ and $V_D$ are the voltage drops across the diodes $D_4$ and $D_5$, $V_{BE}$ is the base-emitter drop of $Q_{13}$ and $R_{10}$ is the value of the resistor $R_{10}$. The value of this current is typically one milliampere. Such a collector current causes the voltage at the gate G of $Q_6$ to drop in the manner previously described by an amount equal to or slightly greater than the gate-to-mid-channel cutoff voltage of $Q_6$ to instantaneously turn off $Q_6$ and reduce the output voltage $V_o$ to zero.

When it is desired to again switch $Q_6$ to a conducting state, the control voltage $V_c$ is again returned to a reference or zero level causing the transistors $Q_{12}$ and $Q_{13}$ to instantaneously change to a non-conductive state. Thus, the state of the control switch 38 controls the conductive state of the constant current source I to apply the constant current signal to a junction of the gate G and the resistors $R_4$ and $R_5$. It bears emphasizing that the value of the current generated by the constant current source I, is proportioned relative to the value of the resistors $R_4$ and $R_5$ such that the voltage drop occuring at the gate G and in response to an activation of the constant current source is just sufficient to turn off $Q_6$, that is equal to or slightly greater than a gate-to-mid-channel cutoff voltage of $Q_6$.

In view of the foregoing, it is appreciated that the present invention provides a high speed switch for analog signals having an extremely low and input signal level independent noise characteristic. Further, being free of gate connected diodes, the switch is substantially temperature insensitive. Still further, since the state of the switch is controlled from a constant current source connected to the gate of the switching FET thereof, and is independent of the input signal level applied thereto, only a small bias voltage is required to maintain the switch in its non-conductive state.

While a particular circuit and particular circuit configurations have been described in some detail herein, changes in modifications may be made without departing from the spirit of the invention. Accordingly, it is intended that the present invention be limited in scope only by the terms of the following claims.

I claim:

1. An analog switch comprising:

a FET having an input for receiving an analog input signal and an output for an analog signal, with the source electrode of said FET connected to said input;

current source means for applying a constant current to the gate electrode of said FET to turn off said FET;

control switch means for activating said current source;

first constant resistance means and a first operational unity gain amplifier directly connected in series between the junction of said current source and gate electrode and said source electrode, with said source electrode connected to the first amplifier input and the first amplifier output connected to said first resistance means, and with the potential at said gate electrode varying as a function of the potential at said FET input when said FET is turned off, and with said first amplifier having a high input impedance and a low bias current for isolating said source electrode from said gate electrode; and second constant resistance means connected between the junction of said current source and gate electrode and the drain electrode of said FET.

2. The analog switch of claim 1 wherein:

said drain electrode is connected to an output terminal for passing said analog input signal applied to said source electrode of said conducting FET; and said analog switch further includes a second operational unity gain amplifier having a high input impedance and low bias current and connected to said drain electrode in series with said second resistance means with said drain electrode connected to the second amplifier input and the second amplifier output connected to said second resistance means for isolating said drain electrode from said gate electrode.

3. The analog switch of claim 1 wherein said FET comprises a semi-conductor channel having said source electrode and said drain electrode at opposite ends thereof and a central gate segment to which said gate electrode is connected, said gate electrode being a distance X from said source electrode and a distance Y from said drain electrode and said first and second resistance means ($R_4$ and $R_5$) having relative values such that $$\frac{X}{X=Y} \text{ equals } \frac{R_4}{R_4+R_5}.$$

4. The analog switch of claim 3 wherein said FET possesses a predetermined gate-to-mid-channel cutoff voltage and said first and second resistance means are proportioned in value relative to the value of current from said current source to produce an immediate voltage drop at said gate electrode equal to or slightly greater than said gate-to-mid-channel cutoff voltage to instantaneously turn off said FET upon said actuation of said current source.

5. The analog switch of claim 4 wherein said gate electrode is at the center of said channel region and said first and second resistance means are equal in value such that said voltage drop at said gate electrode substantially equals one-half a product of said current and the value of one said resistance means.

6. The analog switch of claim 1 wherein said unity gain amplifier comprises:

a first constant current source; and a differential amplifier including first and second matched FET's having their respective source electrodes connected in common to said first constant current source, their respective drain electrodes electrically connected to a constant bias voltage source, the gate electrode of said first FET connected to said input, and the gate electrode of said second FET connected to said first resistance means, and a feedback circuit between said source electrode of first FET and said gate electrode of second FET.

7. The analog switch of claim 6 wherein said unity gain amplifier further includes a second constant current source and said feedback circuit includes a transistor having its emitter connected to said constant bias voltage source, its collector connected to said gate electrode of said second FET and to said second constant current source, and its base connected to said drain electrode of said first FET.

8. The analog switch of claim 1 wherein the current magnitude of said constant current source is predetermined such that the gate voltage is substantially the cutoff voltage of said FET.

* * * * *